(12) United States Patent
Chen

(10) Patent No.: US 6,399,888 B1
(45) Date of Patent: Jun. 4, 2002

(54) BUFFERING AND SUPPORTING DEVICE FOR A CIRCUIT BOARD

(75) Inventor: Chin-Chu Chen, Taipei Hsien (TW)

(73) Assignee: Lite-on Electronics, Inc., Taipei Hsien (TW)

( * ) Notice: Subject to any disclaimer, the term of this patent is extended or adjusted under 35 U.S.C. 154(b) by 0 days.

(21) Appl. No.: 09/696,033

(22) Filed: Oct. 26, 2000

(51) Int. Cl.[7] ............................................. H01B 17/00
(52) U.S. Cl. ..................... 174/138 G; 174/166 S; 361/804; 403/408.1; 411/501
(58) Field of Search ..................... 174/138 D, 138 E, 174/138 G, 156, 157, 158 R, 166 R, 166 S; 361/742, 790, 804; 403/408.1; 411/501

(56) References Cited

U.S. PATENT DOCUMENTS

| | | | | |
|---|---|---|---|---|
| 3,764,729 A | * | 10/1973 | Kowalewski | 174/158 R |
| 3,777,052 A | * | 12/1973 | Fegen | 174/138 D |
| 4,781,488 A | * | 11/1988 | Hayashi | 174/138 D |
| 4,938,703 A | * | 7/1990 | Nakano | 174/138 D |
| 5,191,513 A | * | 3/1993 | Sugiura et al. | 174/138 D |
| 5,223,674 A | * | 6/1993 | Reznikov | 174/138 D |
| 5,963,432 A | * | 10/1999 | Crowley | 361/804 |
| 6,002,588 A | * | 12/1999 | Vos et al. | 174/138 G |
| 6,140,591 A | * | 10/2000 | Osborne et al. | 174/138 E |

* cited by examiner

Primary Examiner—Dean A. Reichard
Assistant Examiner—Adolfo Nino
(74) Attorney, Agent, or Firm—Rosenberg, Klein & Lee

(57) ABSTRACT

A buffering and supporting device for a circuit board is provided. The device includes a lower flexible supporter and an upper buckle head. The upper buckle head engages a hole of the circuit board, and is formed with a plurality of forked elastic wings for abutting against a surface of the circuit board. The flexible supporter has a plate and at least one flexible support portion that is formed, alternatively, by a single integrally formed flexible supporter or a pair of cambered or straight flexible supporting pieces. The upper end of each flexible supporting piece is connected to the bottom of the plate. Where the flexible support portion is formed by a pair of flexible supporting pieces, each flexible supporting piece is connected to a bottom plate. The buffering end supporting device guards the circuit board against ill effects when subjected to vibration, shock, or other vertical source of vertical force.

10 Claims, 6 Drawing Sheets

BUFFERING AND SUPPORTING DEVICE FOR A CIRCUIT BOARD

FIELD OF THE INVENTION

The present invention relates to a buffering and supporting device for a circuit board, and especially to a supporting structure used in a computer mother board.

BACKGROUND OF THE INVENTION

The prior art mother board of a personal computer is firmly secured to a computer housing by screwing its periphery to the computer housing. A supporting device is installed at a middle portion of the mother board to sustain the mother board's weight and to cause the mother board to be retained at a preselected horizontal orientation, and at a proper distance to the bottom surface of the housing. As the prior art structure shown in FIG. 6 illustrates, an upper side of a post 5 has a buckle head 51 and the lower side has a support 52. The buckle head 51 serves to buckle the post 5 to a circuit board. The support 52 only has the effect of supporting. Namely, the solid cylinder support 52 only has the function of supporting without a buffering effect for deformation. Therefore, it cannot meet the requirement of the present invention. Furthermore, given the trend of current computers toward compact designs, the structure of the mother board becomes weaker and weaker. The prior art supporting device has great rigidity in the direction along which it experiences the most bearing force. As result, in the transportation or testing process of a mother board, the supporting position of the mother board by the post 5 is easily destroyed. Thus, the product yield is reduced. Moreover, since the mother board is becoming thinner and thinner, its strength of material is becoming weaker and weaker. Therefore, it becomes more likely that this kind of mother board will be accidentally destroyed or otherwise rendered ineffective.

SUMMARY OF THE INVENTION

Accordingly, the primary object of the present invention is to provide a buffering and supporting device for a circuit board. Since in the prior art, a mother board is combined to a housing, a compact design is a basic requirement of a personal computer. The prior art supporting structure is not suitable, moreover, the design of a mother board must suffer from vibrations. Therefore, the present invention provides a buffering and supporting device, which is connected to a mother board without being screwed to the housing. Furthermore, when the mother board suffers from shocks or vibrations, the flexible support portion on the supporting device will bend and deform for reducing the possibility that the mother board is broken. Meanwhile, the mother board is protected from being damaged.

In order to achieve aforesaid object, the present invention provides a buffering and supporting device for a circuit board comprising a flexible supporter at a lower side thereof and a buckle head at an upper head thereof. The buckle head for retaining to a hole of a circuit board includes a pair of elastic wings extending laterally with the tip of each wing against a surface of a circuit board. The flexible supporter has at least one flexible support portion and an intermediate plate is provided between the buckle head and the flexible supporter. The flexible support portion is installed with a pair of cambered or straight flexible supporting pieces, or a single integral flexible supporting pieces. The upper end of each flexible supporting piece is connected to the bottom of the plate. The lower end of each flexible supporting piece is connected to a bottom plate. Thus, a plurality of flexible support devices serve to sustain the vibrations generated from the circuit board and to provide suffering and supporting force thereto.

The various objects and advantages of the present invention will be more readily understood from the following detailed description when read in conjunction with the appended drawing.

DETAILED DESCRIPTION OF THE PREFERRED EMBODIMENTS

Figure 1:
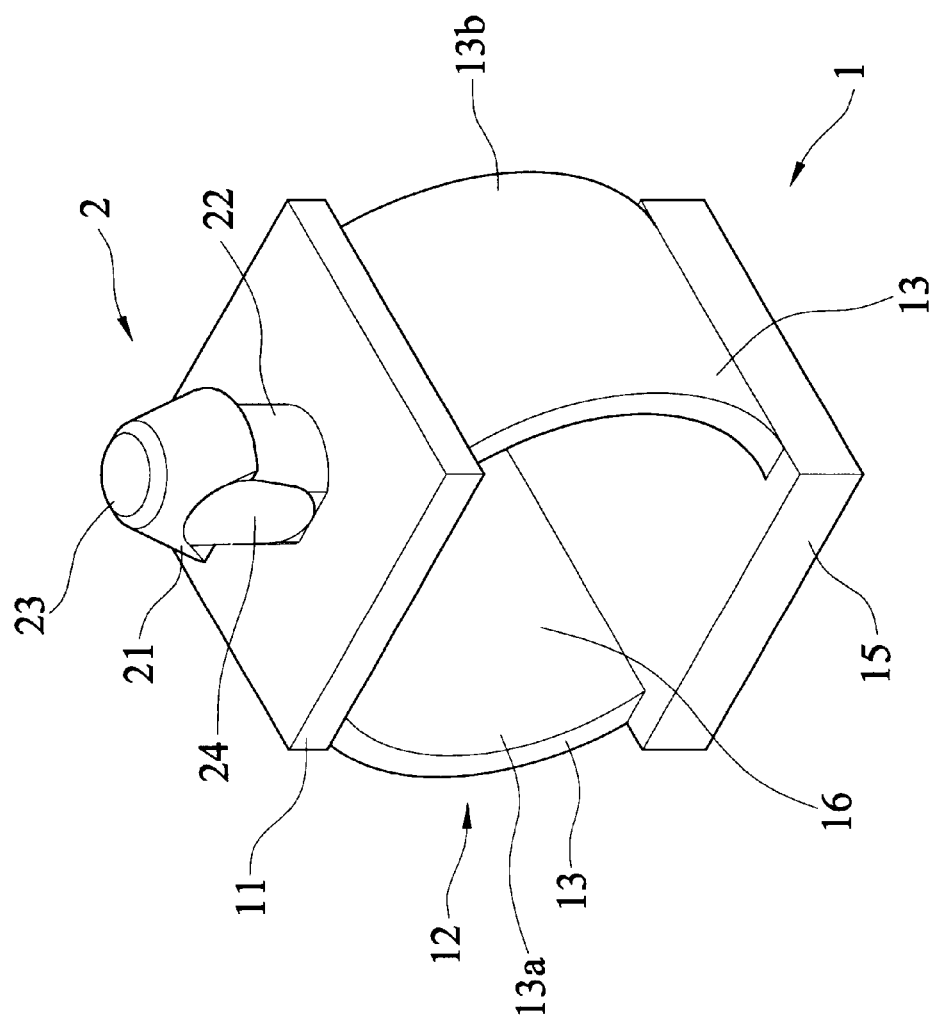
FIG. 1 is a perspective view of the first embodiment of the present invention.
Figure 2:
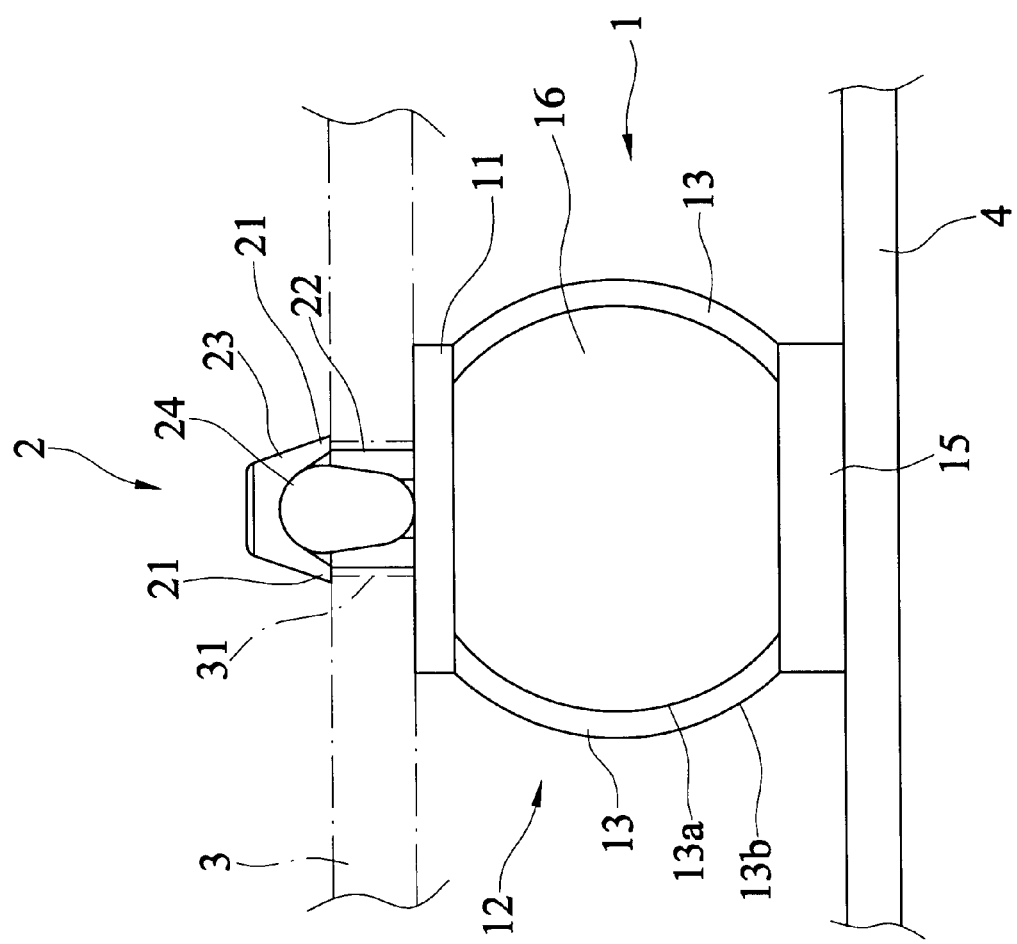
FIG. 2 is a lateral view of the first embodiment of the present invention.
Figure 3:
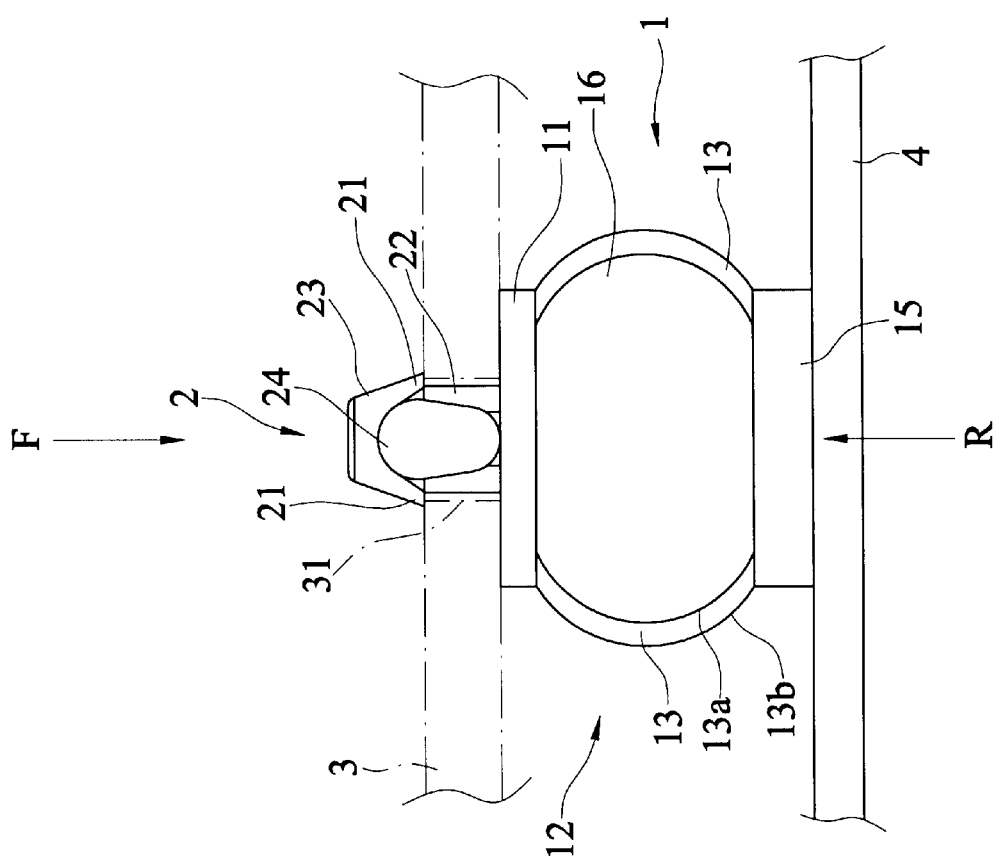
FIG. 3 is a lateral view showing the operation of the first embodiment of the present invention.

Referring to FIGS. 1 to 5, three embodiments of the buffering and supporting device for a circuit board of the present invention are illustrated. In these embodiments, the buffering and supporting device for a circuit board includes a flexible supporter 1 at the lower side and a buckle head 2 at the upper head. The buckle head 2 is provided for retaining to a hole 31 of an external circuit board 3. The forked resilient wing 21 of the buckle head 2 resists against the surface of the circuit board 3 while the buckle head 2 is retained to the hole 31. The supporter 1 has a plate 11 and a flexible support portion 12. The flexible support portion 12 has an upper end connected to the bottom of the plate 11. When a shock or a vibration occurs on the circuit board 3 so that a vertical force or component force F is applied to the flexible supporter 1, as shown in FIG. 3, the flexible supporter 1 will generate a buffer effect. Meanwhile, the flexible support portion 12 will take the force F from the top, and the bottom will suffer a reaction force R from an object 4 which the bottom of the support portion 12 abut against (for example, a bottom plate of a computer housing). As a result, the flexible support portion 12 will deform and generate a buffer effect.

In the first embodiment of the present invention (see FIGS. 1 to 3), the flexible support portion 12 includes a pair of cambered supporting piece 13, each of which has an upper end connected to the plate 11. The lower end thereof is connected to a bottom plate 15. The cambered supporting piece 13 has a cambered inner surface 13a and a cambered outer surface 13b. A transverse through hole 16 is formed between the pair of the cambered supporting pieces 13 and the plate 11 and the bottom plate 15. When a force perpendicular to the plate 11 and from the circuit board 3 is applied to the cambered supporting pieces 13, the cambered supporting pieces 13 will be bent and deformed, and the distance between the plate 11 and the bottom plate 15 is shortened, i.e., the height of the support portion 12 becomes short. Then a supporting force perpendicular to the plate 11 is provided and a buffering effect is achieved. Moreover, the cambered inner surface 13a and the cambered outer surface 13b are deformed. The curvatures at each sections of the inner surface 13a and outer surface 13b change.

Furthermore, the transversal cross section of the traverse through hole 16 also changes.

Figure 6:
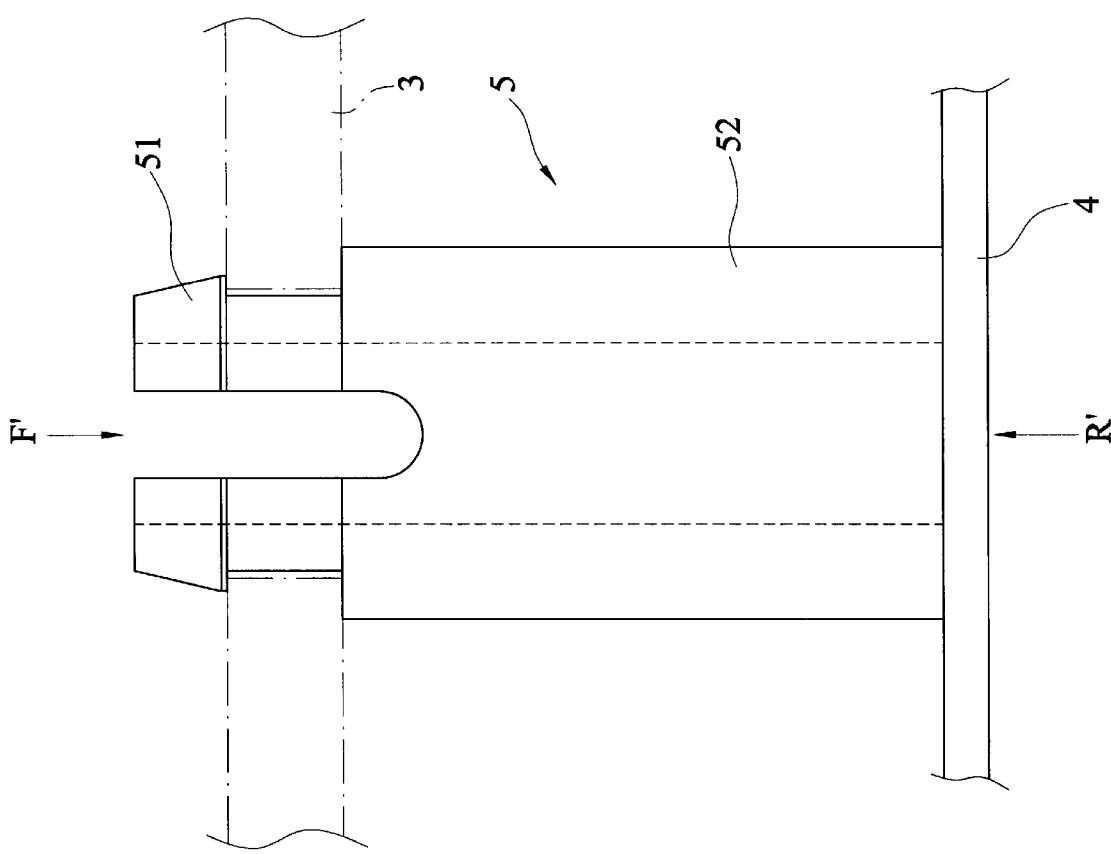
FIG. 6 is lateral view of a conventional supporting device.

On the contrary, when a vertical force or component force F is exerted on the prior art support 52 (shown in FIG. 6), it suffers from a very large resisting force opposite to the direction of force F because the support 52 deforms little due to large stiffness in this direction, and thus a flexible deformation and buffering effect can not be generated. Therefore, when identical shock or vibration occurs, a large force F' (F'>F) and reaction force (R'>R) generates. As a result, a damage is generated on the circuit board 3. By the bottom 15, the buffering and supporting device of a circuit board of the present invention can steadily rest against the object 4.

Figure 4:
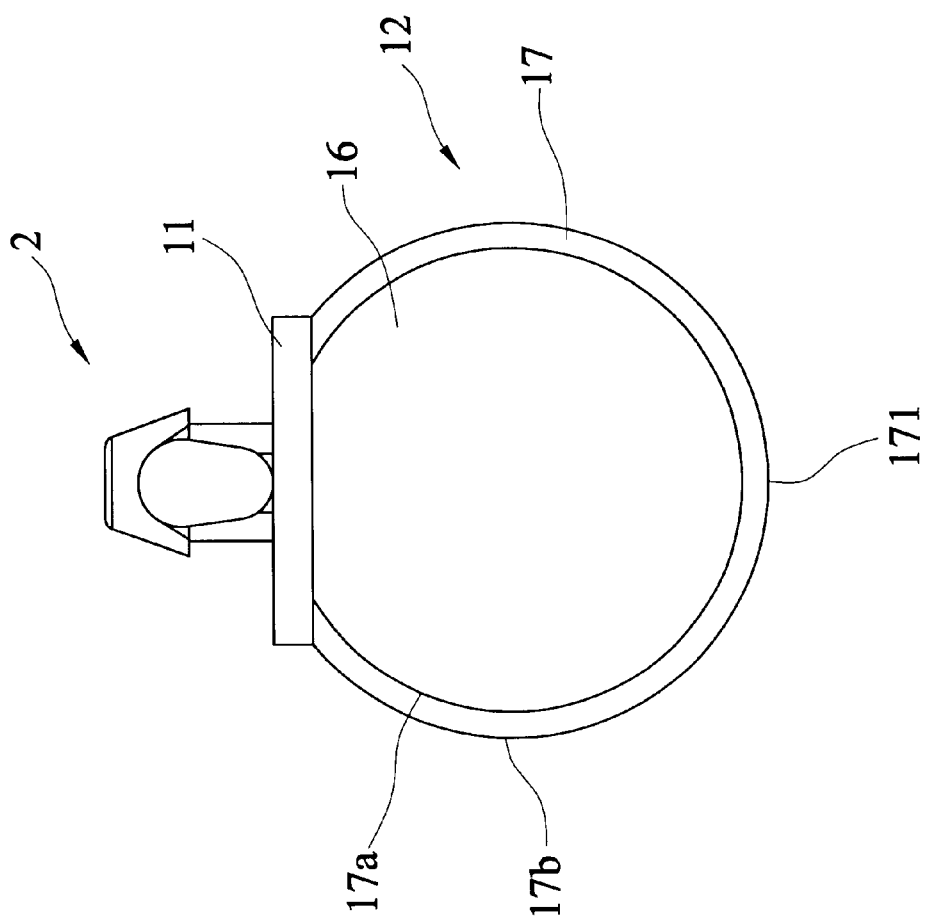
FIG. 4 is a lateral view of the second embodiment of the present invention.

In the second embodiment of the present invention, as shown in FIG. 4, the flexible support portion 12 includes a single long cambered supporting piece 17, the cambered supporting piece 17 has two ends connected to the plate 11, and the center thereof is formed as a traverse through hole 16. The cambered supporting piece 17 has a cambered inner surface 17a and a cambered outer surface 17b at two sides of the cambered supporting piece 17. When the long cambered supporting piece 17 suffers from a force or component force perpendicular to the plate 11, a flexible deformation occurs, and the distance between the plate 11 and bottom 171 of the long cambered supporting piece 17 becomes small, a buffering effect achieves. The long cambered supporting piece 17 and the bottom 171 are formed as an integral arc. The cambered inner surface 17a and the cambered outer surface 17b also deforms. The curvatures at all sections of the cambered inner surface and cambered outer surface change. The cross section of the traverse through hole 16 also changes and the height of the flexible supporter 1 becomes small.

Figure 5:
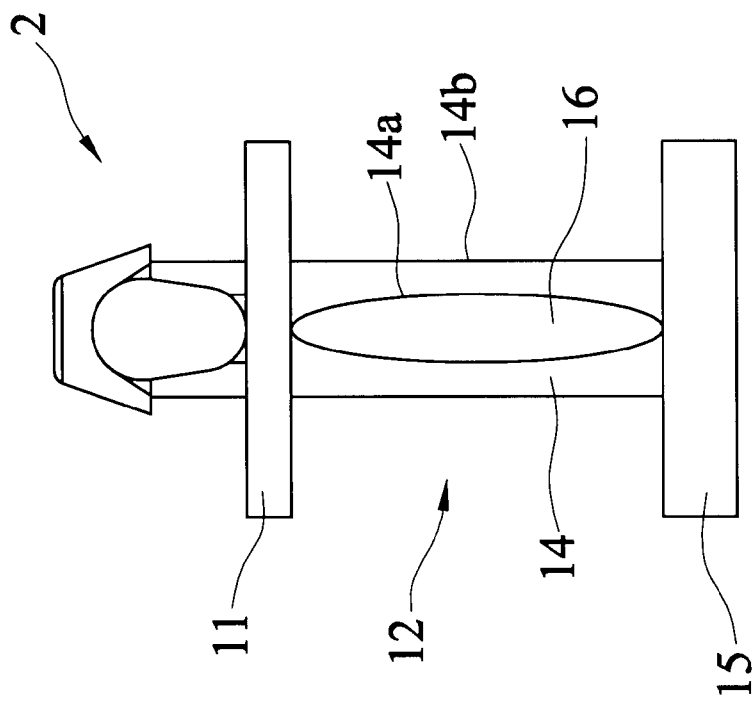
FIG. 5 is a lateral view of the third embodiment of the present invention.

In the third embodiment of the present invention, as shown in FIG. 5, the flexible support portion 12 includes a bottom plate 15 and a flexible supporting piece 14 and a plate 11, both provided on the bottom plate 15. A transversal through hole 16 is formed between the pair of flexible supporting pieces 14. The upper and lower ends of the flexible supporting pieces 14 are connected to the plate 11 and the bottom plate 15, respectively. The center thereof is formed as a traverse through hole 16. The flexible supporting piece 14 has a cambered inner surface 14a and a straight outer surface 14b. When a force perpendicular to the plate 11 is applied to the flexible supporting piece 14, a flexible deformation occurs and the distance between the plate 11 and the bottom plate 15 becomes small so that a buffering effect achieves. The inner surface 14a and outer surface 14b deforms, and the curvatures at all sections of the inner surface and outer surface also change. The cross section of the traverse through hole 16 also changes. Then, the height of the flexible supporter 1 becomes small.

It is appreciated from aforesaid embodiments that in the present invention, the flexible support portion 12 has three types of flexible supporting pieces cambered supporting piece 13 or 17 or a straight flexible supporting piece 14. The upper end of each flexible support portion 12 is connected to the bottom surface of the plate 11. The lower portion of each flexible support portion 12 is connected to a bottom plate 15 or is formed as an integral bottom so that the structure thereof function as a cambered supporting piece 13. Namely, as a force applies thereon, it bends and deforms easily. The buckle head has a tip head 23 for passing through the hole 31 of a circuit board 3. Meanwhile, part of a neck 22 is inserted into hole 31, and then a resilient wing 21 presses on the top of the circuit board 3, while the plate 11 press upon the bottom surface of the circuit board 3. When applying a force, the flexible support portion 12 deforms. Thus, it appears that the present invention has a better bearing effect than that used a prior art design. A penetrating groove 24 is traversely installed in the buckle head 2 so that when the resilient wings 21 pass through the hole 31, each of the two sides of the buckle head 2 has a compressing space.

The buffering and supporting device for a circuit board of the present invention may be made of material, such as Nylon 6, or Nylon 66, or other soft material with a fire-proof level of V2 or above V2 (for example, V1 or V0), and is made by molding injection. It is manufactured easily and has a low cost.

In summary, in the present invention, a soft supporting structure provides a large compliance in force direction and correspondingly, the present invention has a relative low rigidity. Therefore, as a shock or a vibration applies to a mother board, a proper supporting force is provided so that the mother board will not be harmed. Therefore, comparing with the prior art rigid post, the elastic structure of the flexible supporter according to the present invention provides a better use. Thus, it is a structure completely different from the structure in the prior art. Since the specification of the circuit board must suffer from an impact force of 60 g. The prior art design shown in FIG. 6 only sustains from an impact of 40 g. However, through a testing, it has proved that the present invention may sustain from an impact of 80 g, which is two times of the prior art design. Therefore, the reliability of a product is improved. Therefore, the present invention has a buffering effect and meets the requirement in the objects of the present invention so as to provide a preferred protection to a circuit board for suffering from an impact or shock.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A buffering and supporting device for a circuit board comprising an upper buckle head and a lower flexible supporter;

said upper buckle head retentively engaging a hole of the circuit board, said upper buckle head having a plurality of elastic wings extending laterally for abutting against a surface of the circuit board;

said lower flexible supporter including at least one flexible support portion, said flexible support portion including at least one flexible supporting piece, said flexible support portion defining a transverse through hole extending intermediately therein to be at least partially surrounded by said flexible supporting piece, wherein, when said flexible supporter receives a first force from the circuit board, a height of the flexible supporter decreases and the transverse through hole changes in sectional configuration for providing a buffering and supporting second force to the circuit board.

2. The buffering and supporting device for a circuit board as claimed in claim 1, further comprising an intermediate plate connecting to a lower portion of said upper buckle head and to an upper portion of said lower flexible supporter.

3. The buffering and supporting device for a circuit board as claimed in claim 1, wherein said at least one flexible supporting piece each has an arc shape, and an upper end of said flexible supporting piece is connected to said intermediate plate.

4. The buffering and supporting device for a circuit board as claimed in claim 1, wherein said flexible supporting piece has a cambered surface which deforms in receiving said first force.

5. The buffering and supporting device for a circuit board as claimed in claim 1, wherein said flexible supporter and said buckle head are integrally formed with an elastic material by injection molding.

6. A buffering and supporting device for a circuit board comprising:
   an upper buckle head retentively engaging a hole of the circuit board, said upper buckle head having a plurality of elastic wings extending laterally for abutting against a surface of the circuit board;
   an intermediate plate connected to said upper buckle head;
   a lower flexible supporter including at least one flexible support portion, said flexible support portion including at least one flexible supporting piece having an arc shape and an upper end connected to said intermediate plate and flexible support portion defining a transverse through hole at least partially surrounded by said flexible supporting piece, wherein when said flexible supporter receives a first force from the circuit board, a height of the flexible supporter decreases and the transverse through hole changes in sectional configuration for providing a buffering and supporting second force to the circuit board; and
   a bottom plate installed at a bottom of said flexible supporter.

7. The buffering and supporting device for a circuit board as claimed in claim 6, wherein each said flexible supporting piece includes a cambered surface which deforms in receiving said first force.

8. The buffering and supporting device for a circuit board as claimed in claim 7, further comprising a bottom plate installed at a bottom of said flexible supporter.

9. A buffering and supporting device for a circuit board comprising:
   an upper buckle head retentively engaging a hole of the circuit board, said upper buckle head having a plurality of elastic wings extending laterally for abutting against a surface of the circuit board;
   a lower flexible supporter including at least one flexible support portion, said flexible support portion including a single flexible supporting piece having a cambered surface in a shape of a smoothly continuous arc, said flexible support portion defining a transverse through hole at least partially surrounded by said flexible supporting piece, wherein when said flexible supporter receives a first force from the circuit board, a height of the flexible supporter decreases, said cambered surface deforms, and the transverse through hole changes in sectional configuration for providing a buffering and supporting second force to the circuit board.

10. The buffering and supporting device for a circuit board as claimed in claim 9, further comprising an intermediate plate provided between said upper buckle head and said lower flexible supporter with both ends of said single flexible supporting piece connected thereto.

* * * * *